United States Patent
Cho et al.

(10) Patent No.: US 9,741,710 B2
(45) Date of Patent: Aug. 22, 2017

(54) ELECTROSTATIC DISCHARGE PROTECTION DEVICE AND METHOD FOR MANUFACTURING THE SAME, AND CHIP COMPONENT WITH THE SAME

(71) Applicant: SAMSUNG ELECTRO-MECHANICS CO., LTD., Suwon-si, Gyeonggi-do (KR)

(72) Inventors: Jeong Min Cho, Suwon-si (KR); Kyong Bok Min, Suwon-si (KR); Jin Hyuck Yang, Suwon-si (KR); Young Seuck Yoo, Suwon-si (KR); Hong Ryul Lee, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 589 days.

(21) Appl. No.: 14/262,042

(22) Filed: Apr. 25, 2014

(65) Prior Publication Data
US 2014/0321010 A1   Oct. 30, 2014

(30) Foreign Application Priority Data
Apr. 29, 2013   (KR) .................. 10-2013-0047369

(51) Int. Cl.
*H02H 9/04* (2006.01)
*H01L 27/02* (2006.01)

(52) U.S. Cl.
CPC ...... *H01L 27/0288* (2013.01); *H01L 27/0248* (2013.01); *H02H 9/045* (2013.01)

(58) Field of Classification Search
CPC .. H01L 27/0288; H01L 27/0248; H02H 9/045
USPC .......................................................... 361/56
See application file for complete search history.

(56) References Cited

U.S. PATENT DOCUMENTS

| | | | |
|---|---|---|---|
| 9,001,485 B2* | 4/2015 | Nozoe ................ | H01C 7/1006 361/117 |
| 2011/0007439 A1* | 1/2011 | Asakawa ............ | H01F 17/0006 361/56 |
| 2012/0134059 A1* | 5/2012 | Sumi .................. | H01C 1/028 361/56 |

FOREIGN PATENT DOCUMENTS

JP      2012-104665 A      5/2012

* cited by examiner

*Primary Examiner* — Zeev V Kitov
(74) *Attorney, Agent, or Firm* — McDermott Will & Emery LLP

(57) ABSTRACT

An electrostatic discharge protection device includes a base, a plurality of electrodes arranged on the base separated from each other, a function layer supplied on a separation space between the electrodes and a composite insulating layer disposed on the base and composed of inorganic particles dispersed in a resin, the composite insulating layer covering the electrodes and the function layer.

10 Claims, 2 Drawing Sheets

200

ELECTROSTATIC DISCHARGE PROTECTION DEVICE AND METHOD FOR MANUFACTURING THE SAME, AND CHIP COMPONENT WITH THE SAME

CROSS-REFERENCE TO RELATED APPLICATIONS

Claim and incorporate by reference domestic priority application and foreign priority application as follows:

CROSS REFERENCE TO RELATED APPLICATION

This application claims the benefit under 35 U.S.C. Section 119 of Korean Patent Application Serial No. 10-2013-0047369, entitled filed Apr. 29, 2013, which is hereby incorporated by reference in its entirety into this application.

BACKGROUND OF THE INVENTION

1. Field of the Invention

The present invention relates to an electrostatic discharge protection device and a method for manufacturing the same, and a chip component with the same, and more particularly, to an electrostatic discharge protection device and a method for manufacturing the same that can be strong in the shock due to the electrostatic discharge and have a structure with a high heat discharge characteristics.

2. Description of the Related Art

Recently, in order to transmit the large amount of data such as a moving picture, a differential transmission method such as USB, IEEE1394, HDMI or the like have been used. In the high speed interface of the differential transmission method, since the common mode noise is generated due to the unbalance between two signal lines by the characteristics of the communication system, the chip component such as the common mode noise filter (CMF) has been used in order to remove these.

In recent, the chip component of the complex structure provided with the electrostatic discharge protection device on the CMF has been developed. The electrostatic discharge protection device may protect predetermined electronic components from an electrostatic discharge (ESD). The chip component of such complex structure has a structure incorporated therein the electrostatic discharge protection device in the CMF and the electrostatic discharge protection device includes a plurality of electrodes arranged by being separated from each other with a preset gap on a predetermined base, an insulating layer to cover the base and the electrodes and a functional layer supplied on the substrate or the insulating layer or the like.

RELATED ART DOCUMENT

Patent Document

Patent Document 1: Japanese Patent Laid-Open No. 2012-104665

SUMMARY OF THE INVENTION

The present invention has been invented in order to overcome the above-described problems and it is, therefore, an object of the present invention to provide an electrostatic discharge protection device capable of increasing the device reliability by effectively absorbing and protecting the electric shocks during the generation of the electrostatic discharge and the chip component with the same.

It is another object of the present invention to provide an electrostatic discharge protection device capable of improving the heat discharge efficiency by discharging the heat generated during the generation of electrostatic discharge to outside easily and the chip component with the same.

It is another object of the present invention to provide an electrostatic discharge protection device capable of reducing the manufacturing cost and the chip component with the same.

It is another object of the present invention to provide a method for manufacturing an electrostatic discharge protection device capable of increasing the device reliability by effectively absorbing and protecting the electric shocks during the generation of the electrostatic discharge.

It is another object of the present invention to provide a method for manufacturing an electrostatic discharge protection device having a structure to effectively discharge the heat generated during the generation of the electrostatic discharge.

It is another object of the present invention to provide a method for manufacturing an electrostatic discharge protection device capable of reducing the manufacturing cost of the electrostatic discharge protection device and capable of simplifying the manufacturing process thereof.

In accordance with one aspect of the present invention to achieve the object, there is provided an electrostatic discharge protection device including: a base; a plurality of electrodes arranged on the base separated from each other; a function layer supplied on a separation space between the electrodes; and a composite insulating layer on which inorganic particles are dispersed on a resin with covering the electrodes and the function layer on the base.

In accordance with an embodiment of the present invention, the inorganic particles include at least one among silica ($SiO_2$), alumina ($Al_2O_3$), zirconia ($ZrO_2$) and ferrite; and the resin has a thermosetting property or a photo-curable property.

In accordance with an embodiment of the present invention, the composite insulating layer has a relatively large fertilization of the inorganic particles to the resin with reference that the fertilizer ratio of inorganic particles to the resin is 55:45.

In accordance with an embodiment of the present invention, the composite insulating layer includes: a first composite layer arranged on the base and arranged below the electrodes and the function layer; and a second composite layer to cover the electrodes and the function layer on the first composite layer, wherein the function layer is supplied in a shape of a thin film according to a boundary surface of the first composite layer and the second composite layer.

In accordance with an embodiment of the present invention, the composite insulating layer is formed by a screen printing method or a coating method using an alumina-epoxy resin composite material.

In accordance with an embodiment of the present invention, the function layer 230 is formed in a plurality of irregular shape of islands as at least one metal among a palladium Pd, rhodium Rh, silver Ag, gold Au, cobalt Co, tin Sn and nickel Ni.

In accordance with an embodiment of the present invention, the base includes a magnetic substrate.

In accordance with another aspect of the present invention to achieve the object, there is provided a method for manufacturing an electrostatic discharge protection device, including: preparing a base; forming a first composite layer on the base as an inorganic-resin composite material; forming a plurality of electrodes arranged on the first composite layer separated from each other; forming a function layer supplied on the first composite layer and the electrodes in a shape of a thin film; and forming a second composite layer on the electrodes and the function layer as the inorganic-resin composite material.

In accordance with an embodiment of the present invention, the inorganic-resin composite material uses an inorganic particle selected from at least one among silica ($SiO_2$), alumina ($Al_2O_3$), zirconia ($ZrO_2$) and ferrite or a composite material of a thermosetting resin and a photo-curable resin.

In accordance with an embodiment of the present invention, the composite insulating layer has a relatively large fertilization of the inorganic particles to the resin with reference that the fertilizer ratio of inorganic particles to the resin is 55:45.

In accordance with an embodiment of the present invention, the forming the first composite layer and the second composite layer are formed by a screen printing method or a coating method.

In accordance with an embodiment of the present invention, the forming the second composite layer includes: coating the inorganic particle-resin composite material on the first composite layer; and curing the coated inorganic particle-resin composite material.

In accordance with another aspect of the present invention to achieve the object, there is provided a chip component, including: a noise filter; and an electrostatic discharge protection device provided in the noise filter, wherein the electrostatic discharge protection device include: a base; a plurality of electrodes arranged on the base separated from each other; a function layer supplied on a separation space between the electrodes; and a composite insulating layer on which inorganic particles are dispersed on a resin with covering the electrodes and the function layer on the base.

In accordance with an embodiment of the present invention, the noise filter includes: a ferrite substrate; a coil electrode arranged on the ferrite substrate; an external electrode connected to the coil electrode at a peripheral region of the ferrite substrate; and a filler the coil electrode exposed by the external electrode.

In accordance with an embodiment of the present invention, the inorganic particles include at least one among silica ($SiO_2$), alumina ($Al_2O_3$), zirconia ($ZrO_2$) and ferrite; and the resin has a thermosetting property or a photo-curable property.

In accordance with an embodiment of the present invention, the composite insulating layer has a relatively large fertilization of the inorganic particles to the resin with reference that the fertilizer ratio of inorganic particles to the resin is 55:45.

In accordance with an embodiment of the present invention, the composite insulating layer includes: a first composite layer arranged on the base and arranged below the electrodes and the function layer; and a second composite layer to cover the electrodes and the function layer on the first composite layer, wherein the function layer is supplied in a shape of a thin film according to a boundary surface of the first composite layer and the second composite layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
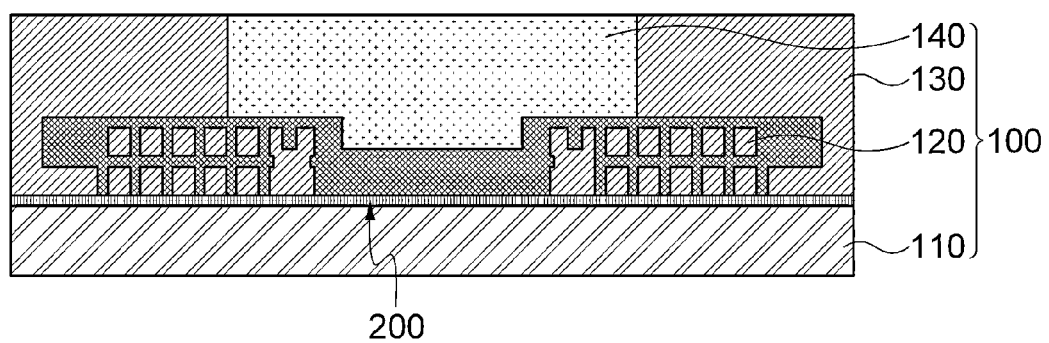
FIG. 1 is a view showing a chip component in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. Further, terms "comprises" and/or "comprising" used herein specify the existence of described shapes, numbers, steps, operations, members, elements, and/or groups thereof, but do not preclude the existence or addition of one or more other shapes, numbers, operations, members, elements, and/or groups thereof.

Hereinafter, an electrostatic discharge protection device and a chip component with the same in accordance with embodiments of the present invention will be described in detail with reference to the following drawings.

FIG. 1 is a view showing a chip component in accordance with an embodiment of the present invention. The chip component 10 in accordance with the embodiment of the present invention may include a structure provided with an electrostatic discharge protection device 200 on a noise filter 100.

The noise filter 100 may be a common mode noise filter (CMF). The noise filter 100 may remove a common mode noise generated in a high speed interface of a differential transmission method.

The noise filter 100 may include a plate 110, a coil 120, an external electrode 130 and a filler 140. The plate 110 may be a plate for manufacturing the components 120, 130 and 140 of the noise filter 100. A magnetic substrate such as a ferrite substrate may be used as the coil 120. The coil 120 may be formed on the ferrite substrate. The coil 120 may be supplied as a multi-layered structure stacked thereon a plurality of coils. The external electrode may be supplied as a structure to cover the external peripheral area of the coil 120. And, the central portion of the external electrode 130 includes an opening to expose the coil 120 and the filler 140 may be a magnetic material such as a ferrite.

The electrostatic discharge protection device 200 may be formed between the substrate 100 and the coil 120. When the surge current, the high voltage and the leakage current or the like are generated, the electrostatic discharge protection device 200 can absorb these.

The chip components 10 of the above-described structure may have a structure capable of absorbing the electrostatic discharge in itself by unifying the noise filter 100 and the electrostatic discharge protection device 200 as one.

Figure 2:
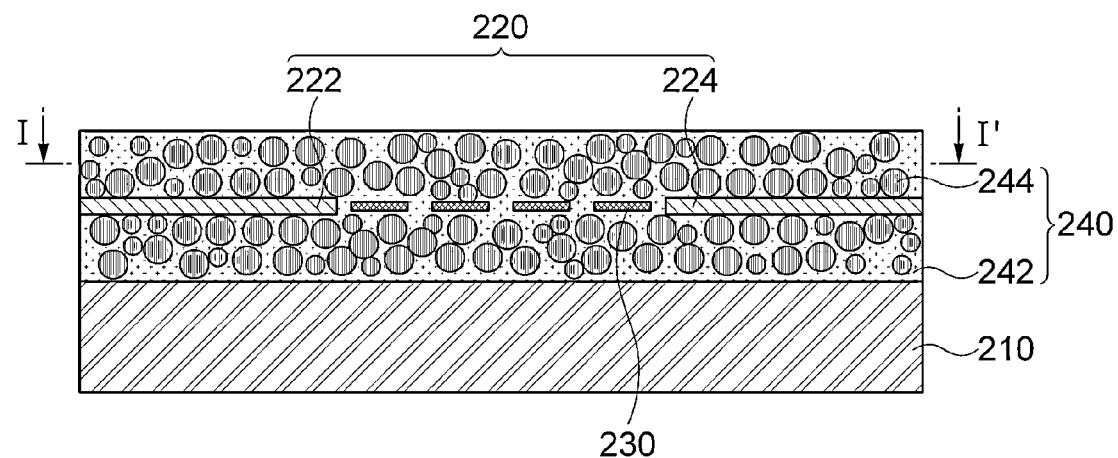
FIG. 2 is a cross-sectional view showing one example of an electrostatic discharge protection device shown in FIG. 1.
Figure 3:
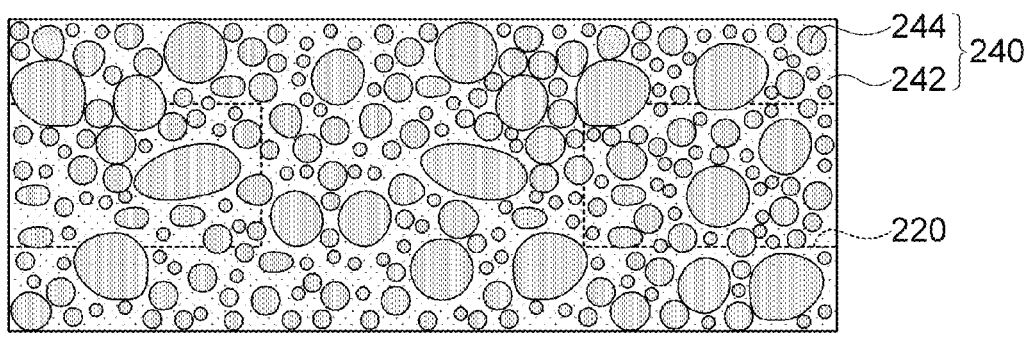
FIG. 3 is a cross-sectional view showing a figure cut along the line I-I' shown in FIG. 2.
Figure 4:
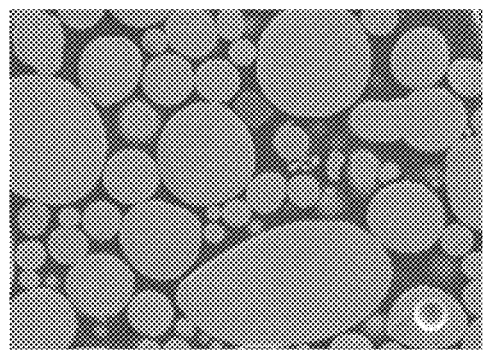
FIG. 4 is a picture showing a composite insulating layer of the electrostatic discharge protection device in accordance with the embodiment of the present invention.

FIG. 2 is a cross-sectional view showing one example of an electrostatic discharge protection device shown in FIG. 1; FIG. 3 is a cross-sectional view showing a figure cut along the line I-I' shown in FIG. 2; and FIG. 4 is a picture showing a composite insulating layer of the electrostatic discharge protection device in accordance with the embodiment of the present invention.

Referring to FIG. 1 to FIG. 4, the electrostatic discharge protection device 200 can include a base 210, a plurality of electrodes 220, a function layer 230 and a composite insulating layer 240.

The base 210 may be a base plate for manufacturing the components 220, 230 and 240 of the electrostatic discharge protection device 200. The base 210 may be formed by various types of the insulating layers. As one example, the magnetic substrate such as the ferrite substrate may be used as the base 210. As another example, an inorganic oxide layer may be used as the base 210. As still another example, a ceramic sheet, a baristor sheet and a substrate made of a liquid crystal polymer material, the other various types of insulating layers or the like may be used as the base 210.

The electrodes 220 may be arranged on the base 210 by being separated from each other. As one example, the electrodes 220 can includes a first electrode 222 arranged on one side of the base 210 and a second electrode 224 faced to the first electrode 222 by being arranged on the other side of the base 210. At least one of the first and second electrodes 222, 224 may be connected to a ground layer. The electrodes 220 may be formed of various types of metals. As one example, the electrodes 220 may be a metal pattern made of copper (Cu).

The function layer 230 may be formed between the electrodes 220. For example, the function layer 230 may be formed in a shape of a thin film on a gap space between the electrodes 220 on the same plane of the electrodes 220. Herein, the function layer 230 may be formed in a shape of plural and irregular islands. And also, the function layer 230 may be irregularly distributed over a whole surface of the base 210 and the electrode 220.

The function layer 230 may be formed of various conductive materials. For example, the function layer 230 may be formed of at least one metal among a palladium Pd, rhodium Rh, silver Ag, gold Au, cobalt Co, tin Sn and nickel Ni. The function layer 230 may be formed of a single metal selected form the above-described metals. But, selectively, the function layer 230 may be formed of an alloy made of at least two among the above-described metals.

The function layer 230 may be formed by performing a metal thin film formation process. As one example, the function layer 230 may be formed by performing a sputtering process using a metal target. As another example, the function layer 230 may be formed by performing an electron beam evaporation process. In addition, the function layer 230 may be formed by performing various types of physical vapor deposition (PVD) such as a thermal evaporation process, a laser molecular beam epitaxy (L-MBE) process and a pulse layer deposition (PLD).

The function layer 230 may have an electric conductivity of an appropriate range. For example, the composite insulating layer 240 can satisfy the electric conductivity $\Omega^{-1}$ cm$^{-1}$ approximately ranging from $10^{-9}$ to $10^3$. If the electric conductivity of the composite insulating layer 240 is below $10^{-9}$, since it becomes to an insulating material due to a drastically low electric conductivity, it is difficult to secure the minimum electric conductivity capable of exhibiting the performance as the function layer. Whereas if the electric conductivity of the composite insulating layer 240 exceeds $10^3$, since it becomes to the conductive material due to the drastically high conductivity, it exceeds to the maximum conductivity capable of exhibiting the performance as the function layer.

The composite insulating layer 240 may have a multi-layered structure. For example, the composite insulating layer 240 may include a first composite layer 242 and a second composite layer 244 stacked on the base 210 in order. The first composite layer may be arranged below the function layer 230, and the second composite layer 244 may be arranged on the function layer 230. Accordingly, the electrodes 220 and the function layer 230 may have a structure arranged along a boundary surface of the first composite layer 242 and the second composite layer 244. In the present embodiments, although the case that the composite insulating layer 240 has a double layered structure divided with reference to the function layer 230 is explained as an example, but the number of layers of the composite insulating layer 240 may be controlled variously. For example, the composite insulating layer 240 may be a multi-layered structure with more than three layers.

On the other hand, the composite insulating layer 240 may be a layer formed by using a composite material of a resin 242 and an inorganic particle 244. More particularly, the composite insulating layer 240 is a layer formed by coating a composite material in a shape of slurry manufactured by distributing the inorganic particles 244 in the resin 242 having a thermosetting or a photo curable on the base 210.

Various types of polymer matrix materials may be used as the resin 242. The resin 242 may use an acryl resin, a polyester resin, a polyimide resin, a phenol resin, a melamine resin, and a resin having at least one selected among the epoxy resins. The inorganic particles 244 may use at least one among calcium carbonate, barium sulfate, silica (SiO$_2$), and alumina (Al$_2$O$_3$). As one example, the composite insulating layer 240 may be made of the alumina and the epoxy resin.

The composite insulating layer 240 may be formed of a composition that the inorganic particles 244 are uniformly distributed in the resin 242. In order to increase the dispersibility of the inorganic particles 244 for the resin 242, various types of dispersants may be used in the manufacturing process of the slurry. Various types of non-polar solvents and polar solvents may be used as the dispersants. The composite insulating layer 240 may be formed by using such slurries with a screen printing method, a coating method, and the other various type of coating method or the like.

Meanwhile, the composite insulating layer 240 may be supplied in such a way that the electric conductivity of the appropriate range of the function layer 230 is not changed. For example, since the function layer 230 is supplied so as to secure the appropriate electric conductivity between the electrodes 220, if the inorganic particles 244 of the composite insulating layer 240 are supplied in a separation space of the electrodes 220, it is difficult to satisfy the electric conductivity of the appropriate range of the function layer 230. Accordingly, it is preferable that the composite insulating layer 240 is arranged in such a way that the inorganic particles 244 are not arranged in the separation space between the electrodes.

The function layer 230 and the composite insulating layer 240 of the above structure can construct the electrostatic discharge absorbing layer to absorb the electrostatic discharge. The electrostatic discharge absorbing layer can be used as a functional layer to absorb or block the electrostatic discharge. Such electrostatic discharge absorbing layer can generate a current path to have an insulation property before the generation of the surge current and to flow the surge current to the electrode only when the surge current is generated, as it is to flow the surge current to the ground layer connected to the electrodes 220 when the surge current, the high voltage and the leakage current or the like are generated in the electrostatic discharge protection device 200.

[Embodiment]

The inorganic particle-resin composite material is manufactured by using the alumina as the inorganic particle and the epoxy resin as the resin. At this time, the filling rate of the alumina and the epoxy resin is controlled as described in the following table 1. In the electrostatic discharge protection device, the first composited layer is manufactured as a bottom layer by coating the inorganic particle-resin composite material on the ferrite magnetic substrate at a thickness ranging approximately from 5 μm to 10 μm, and performing a polishing process after solidifying those. And after the copper electrodes separated from each other with a space of approximately 20 to 30 μm on the first composite layer, the function layer is formed by using a sputtering processing using a gold (Au) target. And, through the same process of the manufacturing process of the first composite layer, the second composite layer is manufactured as a top layer by coating the inorganic particle-resin composite material on the first composite layer formed thereon the function layer with a thickness of approximately 5 to10 μm, and by performing a polishing process after solidifying those.

After the electrostatic discharge (ESD) is applied to the electrostatic discharge protection device manufactured as described the above is applied according to the condition of the table 1, the status of the leakage current is measured according to these.

TABLE 1

| no | Filling ratio of alumina-epoxy | Leakage current after applying ESD* (nA at 5 V) | | | | |
|---|---|---|---|---|---|---|
| uhj | (vol %) | 1 time | 2 times | 3 times | 4 times | 5 times |
| 1 | 45:55 | 0.73 | 19.2 | >100 | >100 | >100 |
| 2 | 55:45 | 0.05 | 0.05 | 0.48 | 15.5 | 19.6 |
| 3 | 65:35 | 0.05 | 0.06 | 0.05 | 0.05 | 0.05 |
| 4 | 70:30 | 0.04 | 0.05 | 0.06 | 0.05 | 0.04 |
| 5 | 75:25 | 0.05 | 0.05 | 0.05 | 0.06 | 0.05 |

*IEC61000-4-2 contact charge (8 kV)

Referring to the table 1, in case when the mixing ratio between the alumina and the epoxy becomes approximately 45:55 in the inorganic particle-resin, it is identified that the function of the electrostatic discharge absorbing layer is not performed by being identified as the leakage current is generated. In case when the relative content of the epoxy resin to the alumina exceeds to a predetermined amount in the composite material, the insulating property of the composite insulating layer excessively increases, the electrostatic discharge is not smoothly flow into the ground layer in the composite insulating layer, and it is stagnated in the composite insulating layer. In this case, the composite insulating layer is damaged due to the stagnation of the electrostatic discharge. But, if the relative content of the alumina increases with reference to the mixing ratio of the alumina and epoxy of 55:45, the electrostatic discharge can be effectively absorbed by securing the appropriate insulating property or the conductivity of the composite insulating layer.

Accordingly, it is preferable that the inorganic particle-resin composite material include the content of the inorganic particle in comparison with the resin with reference to the mixing ratio between the inorganic particle and the resin, and it is preferable that the relative content of the inorganic particle is high with respect to the resin with reference to the preferable mixing ratio of approximately 55:45. Simply, in case when the relative content of the inorganic particle to the resin becomes larger with reference that the mixing ratio of the inorganic particle and the resin is 75:25, the manufacture efficiency of the composite insulating layer may become lower since the physical property and processability of the inorganic particle-resin composite material can be lowered. More particularly, in case when the relative content of the inorganic particle to the resin becomes larger with reference that the relative content ratio of the inorganic particle and the resin is 75:25 and further 80:25, the physical property such as the bonding characteristics of the epoxy resin to contribute to the composite material become drastically deteriorated, if the composite insulating layer is formed by using such composite material, the separation phenomenon or the delamination phenomenon between the ferrite substrate or the electrodes and the insulating composite layer can be generated. Specifically, in case when the content of the epoxy resin is extremely low, the physical property of the composite material itself is lowered, and it is difficult to for the uniform and densified composite coating layer. Accordingly, it is preferable that the mixing ratio between the inorganic particle and the resin is controlled approximately 55:45 to 80:20, and it is further preferable to be controlled from 55:45 to 75:25.

Since the content ratio of the inorganic particle and the resin for the inorganic particle-resin composite material is approximately and uniformly maintained even in the composite insulating layer of the electrostatic discharge protection device, the composite insulating layer also can have the composition to have the content ration of the inorganic particle and the resin approximately being equal to or similar to the content ratio.

As described the above, the electrostatic discharge protection device 200 in accordance with the embodiments of the present invention can include the electrostatic discharge absorbing layer of a structure of which the top and bottom are covered with the composite insulating layer 240 made of the composite material of the resin 242 and the inorganic particle 244. The electrostatic discharge absorbing layer of such structure can effectively absorb and prevent the electrostatic impacts capable of generating during the discharging, and also in comparison with the case when the composite insulating layer is formed with the ferrite composite material the heat generated during the discharging can be easily discharged to the outside due to the relatively high thermal conductivity. Accordingly, the electrostatic discharge protection device in accordance with the present invention and the chip component with the same may have a structure to increase the reliability by effectively absorbing and preventing the electric impacts during the generation of the electrostatic discharge by having a structure of which the top and bottom are covered with the composite insulating layer, wherein the function layer to absorb the electrostatic discharge is made of the resin-inorganic particle composite material, and improve the heat discharge efficiency by easily discharging the heat generated during the electrostatic discharge to the outside.

Since the electrostatic discharge protection device 200 in accordance with the embodiments of the present invention forms the function layer with the composite insulating layer 240 of the inorganic particles such as the silica or the alumina and the polymer material such as the epoxy resin, in comparison with the case when the function layer is implemented with the metal-insulation composite material of the relatively high price, the electrostatic discharge protection device 200 can reduce its manufacturing cost. Accordingly, the electrostatic discharge protection device in accordance with the present invention and the chip component with the same can implement the insulating layer to protect the function layer with the composite material of the resin-inorganic particles having a relatively low cost in comparison with the metal-insulation composite material, thereby drastically reducing the manufacturing cost of the device.

And also, the electrostatic discharge protection device 200 in accordance with the embodiments of the present invention can have the structure to improve the adhesion between the other components, e.g., the base 210 and the electrodes 220, adjacent to the composite insulation layer 240 by using the epoxy resin having the adhesion relatively high in comparison with the metal-insulation composite material as the composite insulating layer 240 to protect the function layer 230. Accordingly, the electrostatic discharge protection device in accordance with the present invention and the chip component with the same can improve the reliability of the electrostatic discharge protection device to protect the function layer as the polymer resin to have the relatively high adhesion.

The electrostatic discharge protection device in accordance with the present invention and a chip component with the same can have a structure to increase the reliability by effectively absorbing and protecting the electric shocks during the generation of the electrostatic discharge by having a structure to cover the top and bottom thereof with the composite insulating layer where the function layer is made of the inorganic particles and the resin of the composite material and to improve the heat discharge efficiency by easily discharging the heat generated during the generation of the electrostatic discharge to outside.

The electrostatic discharge protection device in accordance with the present invention and a chip component with the same can drastically reduce the manufacturing cost of the device by implementing the insulating layer to protect the function layer with the composite material of the resin-inorganic particles having a relatively low cost in comparison with the metal-insulating composite material.

The electrostatic discharge protection device in accordance with the present invention and a chip component with the same can improve the reliability of the electrostatic discharge protection device to protect the function layer as the polymer resin to have the relatively high adhesion.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An electrostatic discharge protection device comprising:
   a base;
   a plurality of electrodes arranged on the base separated from each other;
   a function layer supplied on a separation space between the electrodes; and
   a composite insulating layer disposed on the base and composed of inorganic particles dispersed in a resin, the composite insulating layer covering the electrodes and the function layer,
   wherein the composite insulating layer includes:
   a first composite layer arranged on the base and below the electrodes and the function layer; and
   a second composite layer arranged on the first composite layer to cover the electrodes and the function layer,
   wherein the function layer having a thin film shape is disposed on a boundary surface of the first composite layer and the second composite layer, and
   wherein an entire upper surface of the function layer is covered by the first composite layer and an entire lower surface of the function layer is covered by the second composite layer.

2. The electrostatic discharge protection device according to claim 1, wherein the inorganic particles include at least one among silica ($SiO_2$), alumina ($Al_2O_3$), zirconia ($ZrO_2$) or ferrite; and
   the resin has a thermosetting property or a photo-curable property.

3. The electrostatic discharge protection device according to claim 1, wherein a volume ratio of the inorganic particles with respect to the resin is 55:45.

4. The electrostatic discharge protection device according to claim 1, wherein the composite insulating layer is formed by a screen printing method or a coating method using an alumina-epoxy resin composite material.

5. The electrostatic discharge protection device according to claim 1, wherein the function layer is formed in a plurality of irregular shapes of islands as at least one metal among a palladium Pd, rhodium Rh, silver Ag, gold Au, cobalt Co, tin Sn or nickel Ni.

6. The electrostatic discharge protection device according to claim 1, wherein the base includes a magnetic substrate.

7. A chip component, comprising:
   a noise filter; and
   an electrostatic discharge protection device provided in the noise filter,
   wherein the electrostatic discharge protection device includes:
   a base;
   a plurality of electrodes arranged on the base separated from each other;
   a function layer supplied on a separation space between the electrodes; and a composite insulating layer disposed on the base and composed of inorganic particles dispersed in a resin, the composite insulating layer covering the electrodes and the function layer, wherein the composite insulating layer includes:

a first composite layer arranged on the base and below the electrodes and the function layer; and a second composite layer arranged on the first composite layer to cover the electrodes and the function layer, wherein the function layer having a thin film shape is disposed on a boundary surface of the first composite layer and the second composite layer, and wherein an entire upper surface of the function layer is covered by the first composite layer and an entire lower surface of the function layer is covered by the second composite layer.

8. The chip component according to claim 7, wherein the noise filter includes:

a ferrite substrate;

a coil electrode arranged on the ferrite substrate;

an external electrode connected to the coil electrode at a peripheral region of the ferrite substrate; and a filler covering the coil electrode.

9. The chip component according to claim 7, wherein the inorganic particles include at least one among silica ($SiO_2$), alumina ($Al_2O_3$), zirconia ($ZrO_2$) or ferrite; and the resin has a thermosetting property or a photo-curable property.

10. The chip component according to claim 7, wherein a volume ratio of the inorganic particles with respect to the resin is 55:45.

* * * * *